(12) United States Patent
Huang et al.

(10) Patent No.: US 10,067,000 B2
(45) Date of Patent: Sep. 4, 2018

(54) INVERTER AND RING OSCILLATOR WITH HIGH TEMPERATURE SENSITIVITY

(71) Applicant: MediaTek Inc., Hsin-Chu (TW)

(72) Inventors: Bo-Jr Huang, Hsinchu (TW); Yi-Feng Chen, Xinpu Township, Hsinchu County (TW); Jia-Wei Fang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 295 days.

(21) Appl. No.: 14/855,592

(22) Filed: Sep. 16, 2015

(65) Prior Publication Data

US 2016/0153840 A1 Jun. 2, 2016

Related U.S. Application Data

(60) Provisional application No. 62/085,799, filed on Dec. 1, 2014.

(51) Int. Cl.
*G01K 7/01* (2006.01)
*G01K 7/00* (2006.01)
*H03K 3/03* (2006.01)

(52) U.S. Cl.
CPC ............... *G01K 7/01* (2013.01); *G01K 7/00* (2013.01); *H03K 3/0315* (2013.01)

(58) Field of Classification Search
CPC ...................................................... G01K 7/01
See application file for complete search history.

(56) References Cited

U.S. PATENT DOCUMENTS

| 7,804,372 | B2 | 9/2010 | Nakatani | |
|---|---|---|---|---|
| 7,969,191 | B2 * | 6/2011 | Nedalgi | ......... H03K 19/018521 |
| | | | | 326/81 |
| 8,218,375 | B2 * | 7/2012 | Joo | ........................ G11C 5/147 |
| | | | | 365/189.09 |
| 8,317,393 | B2 * | 11/2012 | Chen | ........................ G01K 7/00 |
| | | | | 374/163 |
| 2011/0006851 | A1 | 1/2011 | Kim | |

(Continued)

FOREIGN PATENT DOCUMENTS

| EP | 0 322 047 | 6/1989 |
|---|---|---|
| JP | 1992324714 | 11/1992 |
| JP | H1022794 | 1/1998 |

(Continued)

OTHER PUBLICATIONS

Liu et al (Analog VLSI:Circuits and Principles. MIT Press, 2002).*

(Continued)

*Primary Examiner* — Clayton E Laballe
*Assistant Examiner* — Leon W Rhodes, Jr.
(74) *Attorney, Agent, or Firm* — McClure, Qualey & Rodack, LLP

(57) ABSTRACT

The invention provides an inverter. The inverter includes a first converter and a second converter. The first converter is coupled between a supply voltage and an output node of the inverter. The second converter is coupled between the output node of the inverter and a ground voltage. The first converter, the second converter, or both include diode-connected transistors. The propagation delay time of the inverter is substantially a linear function of the temperature of the inverter.

15 Claims, 8 Drawing Sheets

(56) References Cited

U.S. PATENT DOCUMENTS

2012/0307867 A1* 12/2012 Chung ................... G01K 7/32
    374/170
2013/0200937 A1* 8/2013 Patil ................... H03H 11/265
    327/284

FOREIGN PATENT DOCUMENTS

| JP | 4843034 | 10/2011 |
| KR | 1020090104362 | 10/2009 |
| KR | 1020110005056 | 1/2011 |
| TW | 200736589 A | 10/2007 |

OTHER PUBLICATIONS

United States Statutory Invention Registration No. USH1744, published Aug. 4, 1998.
Kim, C.Y., et al.; "CMOS Temperature Sensor with Ring Oscillator for Mobile DRAM Self-refresh Control;" IEEE; 2008; pp. 3094-3097.

* cited by examiner

INVERTER AND RING OSCILLATOR WITH HIGH TEMPERATURE SENSITIVITY

CROSS REFERENCE TO RELATED APPLICATIONS

This application claims the benefit of U.S. Provisional Application No. 62/085,799, filed on Dec. 1, 2014, the entirety of which is incorporated by reference herein.

BACKGROUND OF THE INVENTION

Field of the Invention

The disclosure generally relates to an inverter, and more specifically, to an inverter and a ring oscillator with high temperature sensitivity.

Description of the Related Art

Thermal sensors are indispensable elements that can help prevent chips from overheating, and therefore they are commonly used in the field of integrated circuits. Conventional thermal sensors are generally implemented with BJT (Bipolar Junction Transistor)-based, diode-based, or resistor-based components. Although these components have high temperature sensitivity, their large size and analogous outputs are not suitable for application in small digital circuits. On the other hand, digital thermal sensors, such as conventional ring oscillators are small, but they have poor output linearity and low temperature sensitivity. As a result, there is a need to design a novel thermal sensor to overcome the problem of the prior art.

BRIEF SUMMARY OF THE INVENTION

In one exemplary embodiment, the disclosure is directed to an inverter. The inverter includes a first converter and a second converter. The first converter is coupled between a supply voltage and an output node of the inverter. The second converter is coupled between the output node of the inverter and a ground voltage. The first converter, the second converter, or both include diode-connected transistors. The propagation delay time of the inverter is substantially a linear function of the temperature of the inverter.

In some embodiments, the first converter, the second converter, or both include diode-connected MOSFETs (Metal Oxide Semiconductor Field Effect Transistors).

In some embodiments, the propagation delay time of the inverter is substantially a linear function of a temperature of the inverter.

In some embodiments, the first converter includes a PMOS transistor (P-type Metal Oxide Semiconductor Field Effect Transistor). The PMOS transistor has a control terminal coupled to the input node, a first terminal coupled to the supply voltage, and a second terminal coupled to the output node.

In some embodiments, the first converter includes a first PMOS transistor (P-type Metal Oxide Semiconductor Field Effect Transistor) and a second PMOS transistor. The first PMOS transistor has a control terminal coupled to the input node, a first terminal, and a second terminal coupled to the output node. The second PMOS transistor has a control terminal coupled to the first terminal of the first PMOS transistor, a first terminal coupled to the supply voltage, and a second terminal coupled to the output node.

In some embodiments, the second converter includes an NMOS transistor (N-type Metal Oxide Semiconductor Field Effect Transistor). The NMOS transistor has a control terminal coupled to the input node, a first terminal coupled to the ground voltage, and a second terminal coupled to the output node.

In some embodiments, the second converter includes a first NMOS transistor (N-type Metal Oxide Semiconductor Field Effect Transistor) and a second NMOS transistor. The first NMOS transistor has a control terminal coupled to the input node, a first terminal, and a second terminal coupled to the output node. The second NMOS transistor has a control terminal coupled to the first terminal of the first NMOS transistor, a first terminal coupled to the ground voltage, and a second terminal coupled to the output node.

In some embodiments, the inverter further includes a first switch. The first switch is coupled between the supply voltage and the first converter. The first switch selectively enables and disables the first converter according to an inverted enable signal.

In some embodiments, the inverter further includes a second switch. The second switch is coupled between the second converter and the ground voltage. The second switch selectively enables and disables the second converter according to an enable signal.

In one exemplary embodiment, the disclosure is directed to a ring oscillator. The ring oscillator includes a control gate, a first inverter, and a second inverter. A ring structure is formed by cascading the control gate, the first inverter, and the second inverter. Each of the first inverter and the second inverter has an input node and an output node, and includes a first converter and a second converter. The first converter is coupled between a supply voltage and the output node. The second converter is coupled between the output node and a ground voltage. The first converter, the second converter, or both include diode-connected transistors.

In some embodiments, the propagation delay time of each of the first inverter and the second inverter is substantially a linear function of a temperature of the ring oscillator.

In some embodiments, the control gate is a NAND gate and has a first input terminal for receiving an enable signal, a second input terminal coupled to the output node of the second inverter, and an output terminal coupled to the input node of the first inverter.

In some embodiments, the ring oscillator further includes a third inverter, a first switch, and a second switch. The third inverter has an input terminal for receiving the enable signal, and an output terminal for outputting an inverted enable signal. The first switch is coupled between the supply voltage and the first inverter. The first switch selectively enables and disables the first inverter according to the inverted enable signal. The second switch is coupled between the supply voltage and the second inverter. The second switch selectively enables and disables the second inverter according to the inverted enable signal.

In some embodiments, the ring oscillator further includes a third switch and a fourth switch. The third switch is coupled between the first inverter and the ground voltage. The third switch selectively enables and disables the first inverter according to the enable signal. The fourth switch is coupled between the second inverter and the ground voltage. The fourth switch selectively enables and disables the second inverter according to the enable signal.

In some embodiments, if the temperature of the ring oscillator increases by 1 degree Celsius, the output frequency of the ring oscillator increases by about 9 MHz.

In one exemplary embodiment, the disclosure is directed to a thermal sensor. The thermal sensor includes a ring oscillator. The ring oscillator includes a control gate, a first inverter, and a second inverter. A ring structure is formed by cascading the control gate, the first inverter, and the second inverter. Each of the first inverter and the second inverter has an input node and an output node, and includes a first converter and a second converter. The first converter is coupled between a supply voltage and the output node. The second converter is coupled between the output node and a ground voltage. The first converter, the second converter, or both include diode-connected transistors. An output frequency of the ring oscillator is used to indicate a temperature of the ring oscillator.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention will be described in detail as follows.

Figure 1:
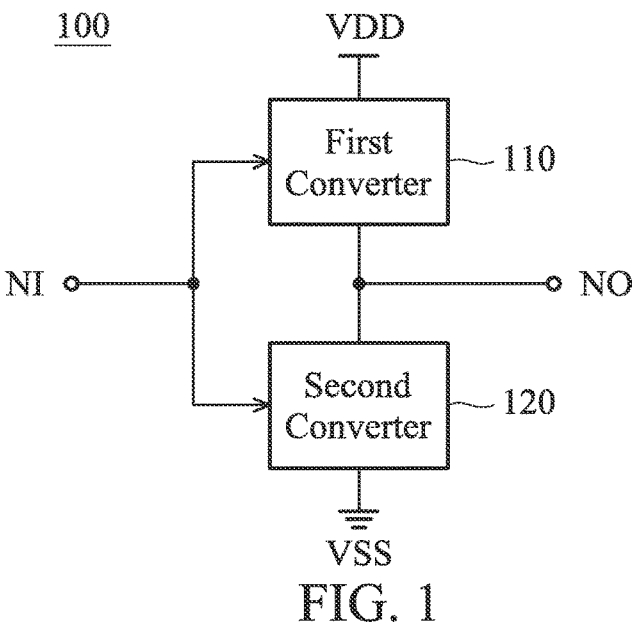
FIG. 1 is a diagram of an inverter according to an embodiment of the invention.

FIG. 1 is a diagram of an inverter 100 according to an embodiment of the invention. The inverter 100 has an input node NI and an output node NO. The input node NI is arranged for receiving an input signal. The output node NO is arranged for outputting an output signal. The logic level of the output signal is complementary to that of the input signal. For example, if the input signal has a high logic level "1", the output signal should have a low logic level "0". There is a propagation delay time between the transitions of the input signal and the output signal. For example, if the input signal becomes a low logic level, the output signal will become a high logic level a specific time period later. The specific time period (e.g., several nanoseconds) may be considered as the propagation delay time of the inverter 100.

As shown in FIG. 1, the inverter 100 includes a first converter 110 and a second converter 120. The first converter 110 is coupled between a supply voltage VDD and the output node NO. The first converter 110 selectively pulls up the voltage at the output node NO to the supply voltage VDD. The second converter 120 is coupled between the output node NO and a ground voltage VSS. The second converter 120 selectively pulls down the voltage at the output node NO to the ground voltage VSS. In a preferred embodiment, the first converter 110, the second converter 120, or both include diode-connected transistors. For example, the diode-connected transistors may be diode-connected MOSFETs (Metal Oxide Semiconductor Field Effect Transistors). Such a design can significantly improve the linearity of the inverter 100, and therefore the inverter 100 can be applied in the field of thermal sensors.

The following embodiments describe some different configurations of the inverter 100 with diode-connected transistors. It should be understood that these embodiments are just exemplary, rather than limitations of the invention.

Figure 2A:
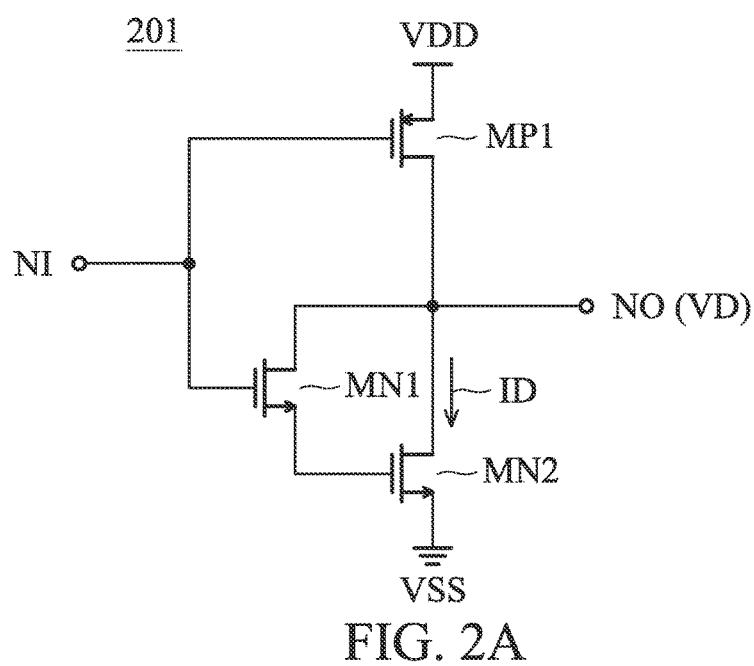
FIG. 2A is a diagram of an inverter according to an embodiment of the invention.

FIG. 2A is a diagram of an inverter 201 according to an embodiment of the invention. In the inverter 201 of the embodiment of FIG. 2A, the first converter includes a PMOS transistor (P-type Metal Oxide Semiconductor Field Effect Transistor) MP1, and the second converter includes a first NMOS transistor (N-type Metal Oxide Semiconductor Field Effect Transistor) MN1 and a second NMOS transistor MN2. The PMOS transistor MP1 has a control terminal coupled to the input node NI, a first terminal coupled to the supply voltage VDD, and a second terminal coupled to the output node NO. The first NMOS transistor MN1 has a control terminal coupled to the input node NI, a first terminal, and a second terminal coupled to the output node NO. The second NMOS transistor MN2 has a control terminal coupled to the first terminal of the first NMOS transistor MN1, a first terminal coupled to the ground voltage VSS, and a second terminal coupled to the output node NO. In the embodiment of FIG. 2A, the diode-connected transistors are formed by the first NMOS transistor MN1 and the second NMOS transistor MN2, and their characteristics are shown in FIG. 3. FIG. 3 is a diagram of the relationship between a voltage VD and a current ID in the diode-connected transistors according to an embodiment of the invention. In the embodiments of FIGS. 2 and 3, the voltage VD represents the voltage at the output node NO, and the current ID represents the current flowing through the second NMOS transistor MN2. As shown in FIG. 3, when the diode-connected transistors are enabled (e.g., the voltage at the input node NI is set to a high logic level, in the embodiment of FIG. 2A, such that both the first NMOS transistor MN1 and the second NMOS transistor MN2 are turned on), the relation curve of their voltage VD and current ID is very similar to that of a general diode. For example, the diode-connected transistors have a cut-in voltage (about 0.35V) and an exponentially-rising current in their active region (in which the voltage VD is greater than 0.4V). The anode of the diode-connected transistors is coupled to the output node NO, and the cathode of the diode-connected transistors is coupled to the ground voltage VSS. Since the layout area of the diode-connected transistors is much smaller than that of a general diode, the diode-connected transistors can serve as an essential diode component in the field of thermal sensors, and it can provide good characteristics without occupying too large area on the chip.

Figure 2B:
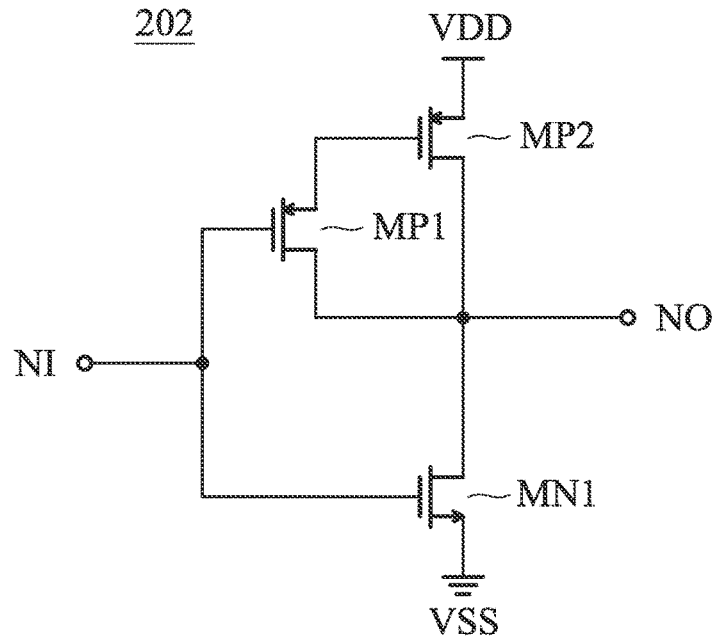
FIG. 2B is a diagram of an inverter according to an embodiment of the invention.
Figure 3:
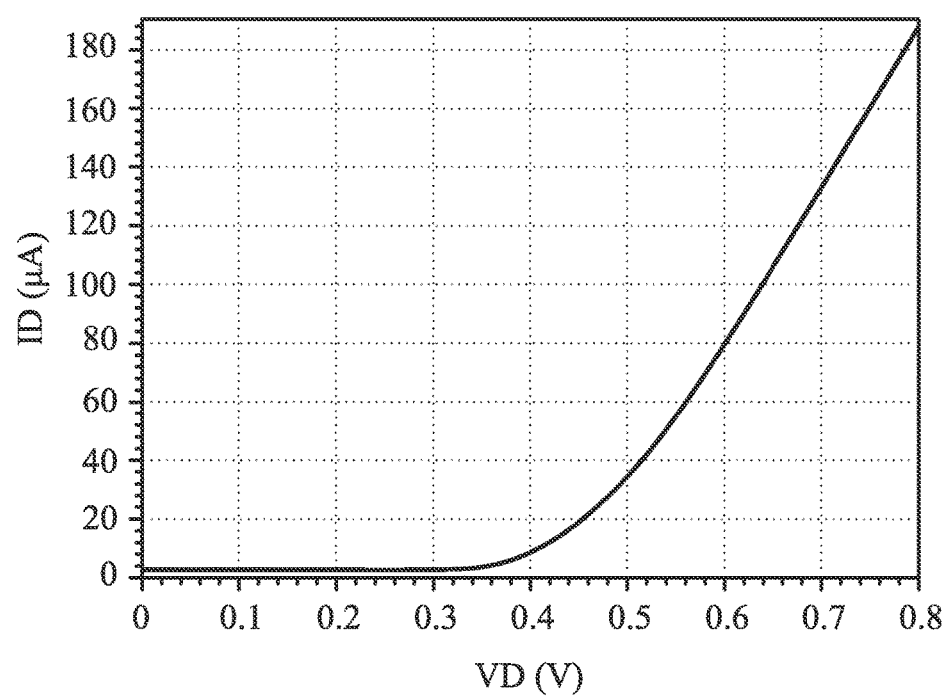
FIG. 3 is a diagram of the relationship between voltage and current in diode-connected transistors according to an embodiment of the invention.

FIG. 2B is a diagram of an inverter 202 according to an embodiment of the invention. In the inverter 202 of the embodiment of FIG. 2B, the first converter includes a first PMOS transistor MP1 and a second PMOS transistor MP2, and the second converter includes an NMOS transistor MN1. The first PMOS transistor MP1 has a control terminal coupled to the input node NI, a first terminal, and a second terminal coupled to the output node NO. The second PMOS transistor MP2 has a control terminal coupled to the first terminal of the first PMOS transistor MP1, a first terminal coupled to the supply voltage VDD, and a second terminal coupled to the output node NO. The NMOS transistor MN1 has a control terminal coupled to the input node NI, a first terminal coupled to the ground voltage VSS, and a second terminal coupled to the output node NO. In the embodiment of FIG. 2B, the diode-connected transistors are formed by the first PMOS transistor MP1 and the second PMOS transistor MP2. The anode of the diode-connected transistors is coupled to the supply voltage VDD, and the cathode of the diode-connected transistors is coupled to the output node NO. Other features of the inverter 202 of FIG. 2B are similar to those of the inverter 201 of FIG. 2A. As a result, the two embodiments can achieve similar levels of performance.

Figure 2C:
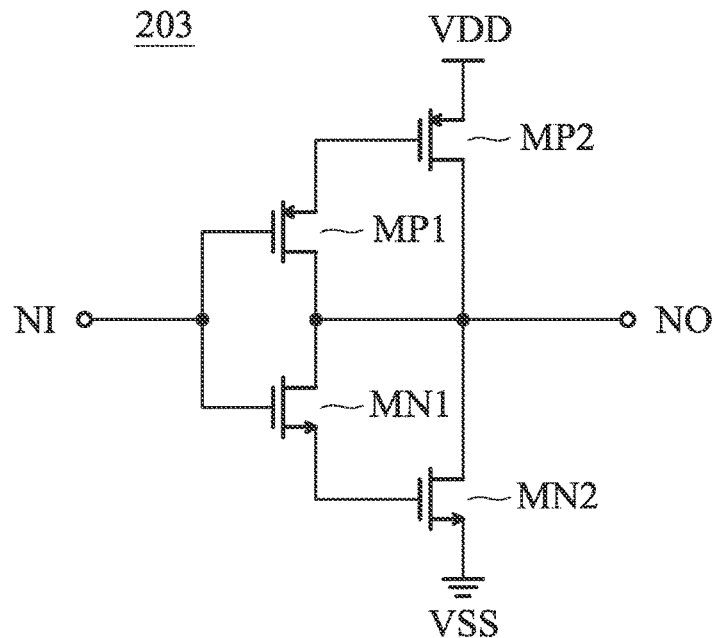
FIG. 2C is a diagram of an inverter according to an embodiment of the invention.

FIG. 2C is a diagram of an inverter 203 according to an embodiment of the invention. In the inverter 203 of the embodiment of FIG. 2C, the first converter includes a first PMOS transistor MP1 and a second PMOS transistor MP2, and the second converter includes a first NMOS transistor MN1 and a second NMOS transistor MN2. The first PMOS transistor MP1 has a control terminal coupled to the input node NI, a first terminal, and a second terminal coupled to the output node NO. The second PMOS transistor MP2 has a control terminal coupled to the first terminal of the first PMOS transistor MP1, a first terminal coupled to the supply voltage VDD, and a second terminal coupled to the output node NO. The first NMOS transistor MN1 has a control terminal coupled to the input node NI, a first terminal, and a second terminal coupled to the output node NO. The second NMOS transistor MN2 has a control terminal coupled to the first terminal of the first NMOS transistor MN1, a first terminal coupled to the ground voltage VSS, and a second terminal coupled to the output node NO. In the embodiment of FIG. 2C, the diode-connected transistors are formed by a first pair of the first PMOS transistor MP1 and the second PMOS transistor MP2, and a second pair of the first NMOS transistor MN1 and the second NMOS transistor MN2. The anode of the first pair of diode-connected transistors is coupled to the supply voltage VDD, and the cathode of the first pair of diode-connected transistors is coupled to the output node NO. The anode of the second pair of diode-connected transistors is coupled to the output node NO, and the cathode of the second pair of diode-connected transistors is coupled to the ground voltage VSS. Other features of the inverter 203 of FIG. 2C are similar to those of the inverter 201 of FIG. 2A. As a result, the two embodiments can achieve similar levels of performance.

Figure 4:
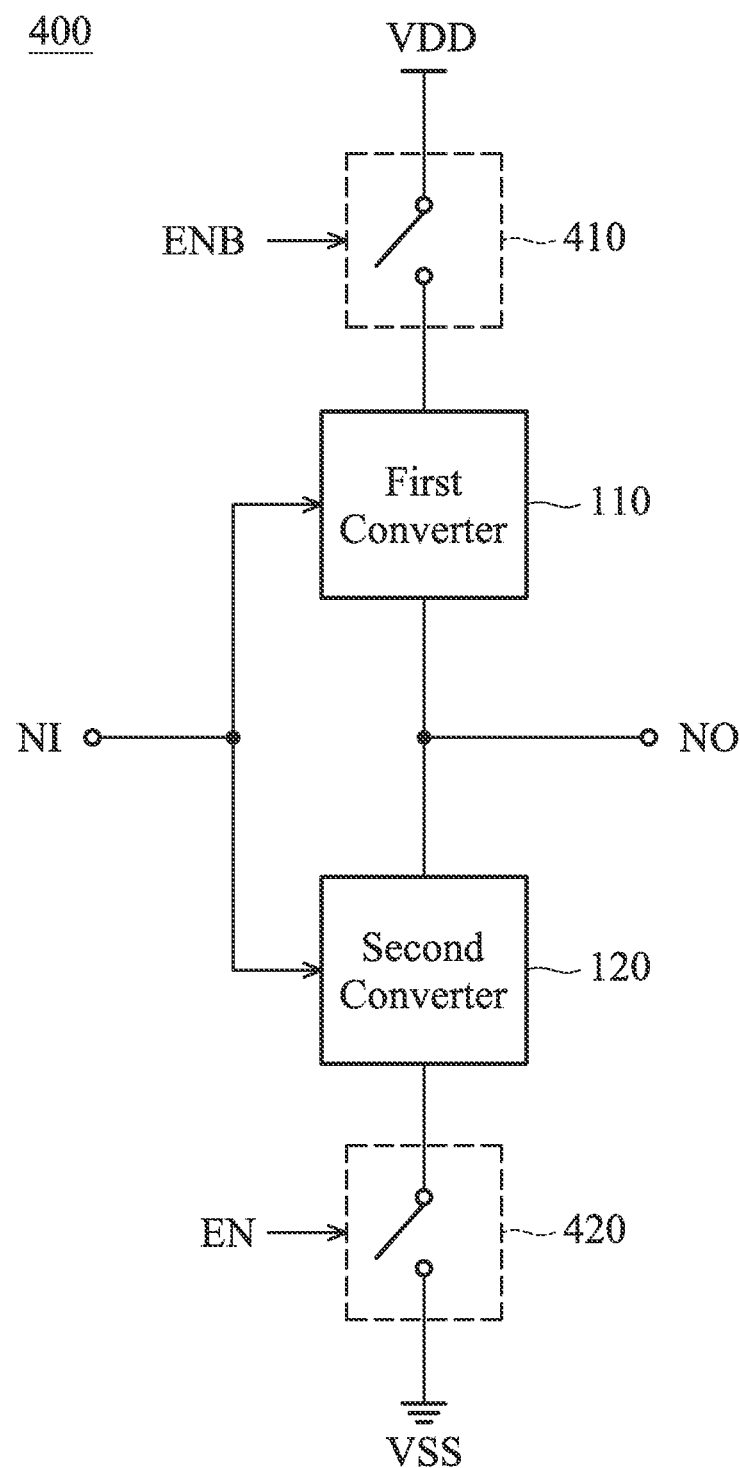
FIG. 4 is a diagram of an inverter according to an embodiment of the invention.

FIG. 4 is a diagram of an inverter 400 according to an embodiment of the invention. In the inverter 400 of the embodiment of FIG. 4, a first switch 410 and a second switch 420 are added into the current path of the inverter 400 from the supply voltage VDD to the ground voltage VSS. The first switch 410 is coupled between the supply voltage VDD and the first converter 110. The first switch 410 selectively enables and disables the first converter 110 according to an inverted enable signal ENB. For example, if the inverted enable signal ENB has a high logic level, the first switch 410 may be opened and the first converter 110 may be disabled, and if the inverted enable signal ENB has a low logic level, the first switch 410 may be closed and the first converter 110 may be enabled. The second switch 420 is coupled between the second converter 120 and the ground voltage VSS. The second switch 420 selectively enables and disables the second converter 120 according to an enable signal EN. For example, if the enable signal EN has a high logic level, the second switch 420 may be closed and the second converter 120 may be enabled, and if the enable signal EN has a low logic level, the second switch 420 may be opened and the second converter 120 may be disabled. The first switch 410 and the second switch 420 are configured to selectively connect and disconnect the current path from the supply voltage VDD to the ground voltage VSS, thereby eliminating the current leakage and reducing the total power consumption of the inverter 400. In alternative embodiments, the inverter 400 includes only either the first switch 410 or the second switch 420, and it still has similar performance. Each of the first switch 410 and the second switch 420 may be implemented with a transistor. For example, the first switch 410 may be implemented with a PMOS transistor, and the second switch 420 may be implemented with an NMOS transistor. Other features of the inverter 400 of FIG. 4 are similar to those of the inverter 201 of FIG. 2A. As a result, the two embodiments can achieve similar levels of performance.

According to practical measurements, the propagation delay time of the inverter 100 with diode-connected transistors (e.g., the configurations of the inverters 201, 202, 203, and 400) is substantially a linear function of the temperature of the inverter 100. Specifically, the relationship between the propagation delay time and the temperature may be substantially represented by equation (1).

$$\text{PDT}=f(T)=A\times T+B \tag{1}$$

where PDT represents the propagation delay time of the inverter 100, T represents the temperature of the inverter 100, A represents a first constant, and B represents a second constant. In other words, the correlation coefficient between the propagation delay time and the temperature of the inverter 100 can be or very close to 1 or −1. Since the inverter 100 with diode-connected transistors has good linearity between the propagation delay time and the temperature, it is suitable for application in the field of thermal sensors. Please refer to the following embodiments.

Figure 5:
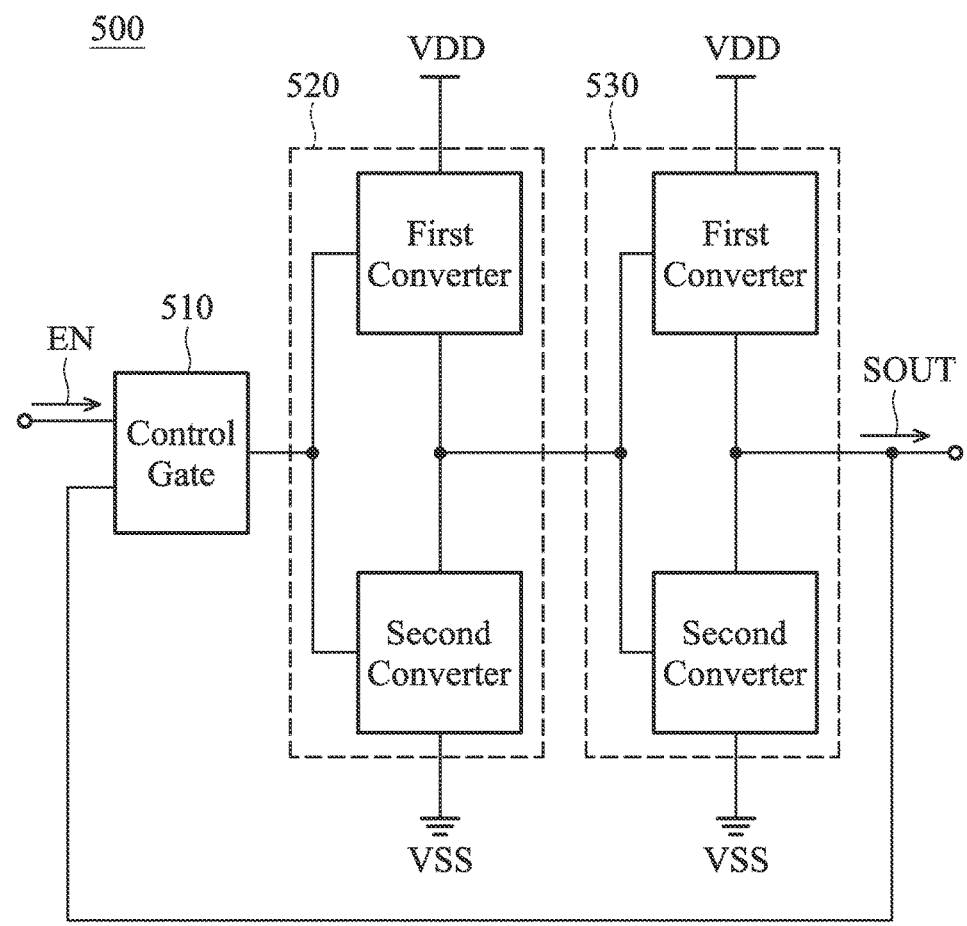
FIG. 5 is a diagram of a ring oscillator according to an embodiment of the invention.

FIG. 5 is a diagram of a ring oscillator 500 according to an embodiment of the invention. In the embodiment of FIG. 5, the ring oscillator 500 includes a control gate 510, a first inverter 520, and a second inverter 530. The control gate 510 selectively enables and disables the ring oscillator 500 according to an enable signal EN. A ring structure is formed by cascading the control gate 510, the first inverter 520, and the second inverter 530. Each of the first inverter 520 and the second inverter 530 includes a first converter and a second converter, as mentioned in the embodiment of FIG. 1. The first converter, the second converter, or both include diode-connected transistors, as mentioned in the embodiments of FIGS. 2A-2C. The propagation delay time of each of the first inverter 520 and the second inverter 530 is substantially a linear function of the temperature of the ring oscillator 500, as described in the equation (1). Because the propagation delay time is linearly related to the temperature, the frequency of an output signal SOUT from the ring oscillator 500 can be used to indicate the current temperature. The ring oscillator 500 is configured as a thermal sensor, and its output frequency represents the corresponding temperature on the chip.

The following embodiments describe some different configurations of the ring oscillator 500. It should be understood that these embodiments are just exemplary, rather than limitations of the invention.

Figure 6:
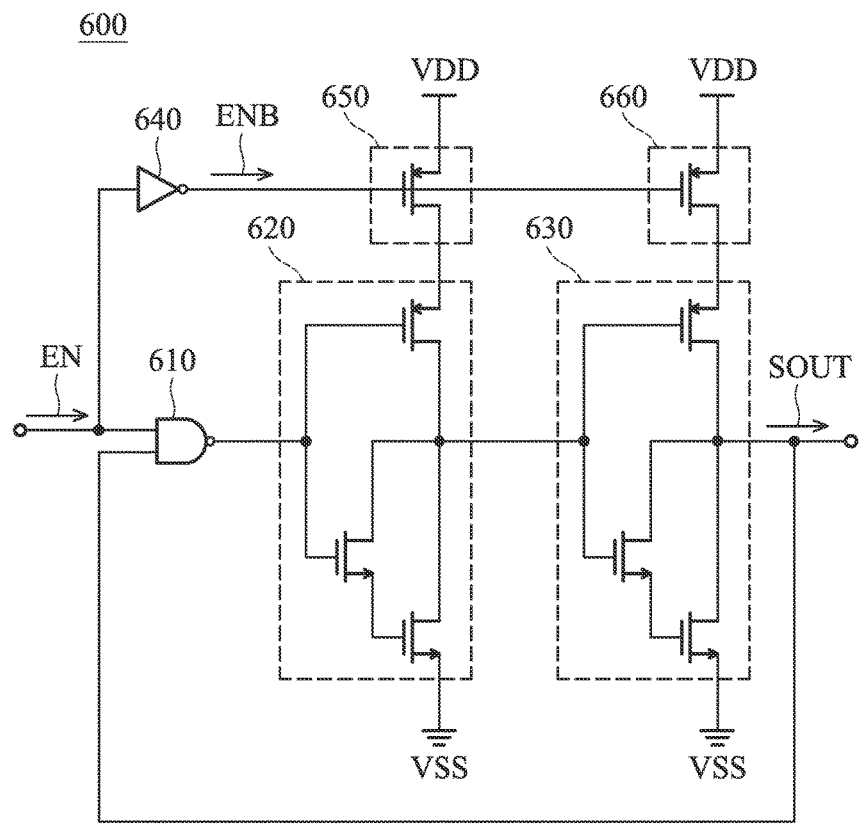
FIG. 6 is a diagram of a ring oscillator according to an embodiment of the invention.

FIG. 6 is a diagram of a ring oscillator 600 according to an embodiment of the invention. In the embodiment of FIG. 6, the ring oscillator 600 includes a control gate 610, a first inverter 620, a second inverter 630, a third inverter 640, a first switch 650, and a second switch 660. The control gate 610 may be implemented with a NAND gate. The NAND gate has a first input terminal for receiving an enable signal EN, a second input terminal coupled to the output node of the second inverter 630, and an output terminal coupled to the input node of the first inverter 620. A ring structure is formed by cascading the NAND gate, the first inverter 620, and the second inverter 630. When the enable signal EN has a high logic level, the ring oscillator 600 operates in a work mode and outputs an output signal SOUT. When the enable signal EN has a low logic level, the ring oscillator 600 operates in a standby mode and stops outputting any signal. Each of the first inverter 620 and the second inverter 630 includes a PMOS transistor, a first NMOS transistor, and a second NMOS transistor, as described in the embodiment of FIG. 2A. Although there are only two cascading inverters displayed in FIG. 6, it should be understood that the ring oscillator 600 may include any even number of cascading inverters, following the NAND gate, so as to form the ring structure. In alternative embodiments, the first inverter 620 and/or the second inverter 630 may use the inverter configurations of FIGS. 2B or 2C, rather than the inverter configuration of FIG. 2A. The third inverter 640 has an input terminal for receiving the enable signal EN, and an output terminal for outputting an inverted enable signal ENB. The first switch 650 is coupled between the supply voltage VDD and the first inverter 620. The first switch 650 selectively enables and disables the first inverter 620 according to the inverted enable signal ENB. The second switch 660 is coupled between the supply voltage VDD and the second inverter 630. The second switch 660 selectively enables and disables the second inverter 630 according to the inverted enable signal ENB. Specifically, each of the first switch 650 and the second switch 660 may be implemented with a PMOS transistor, which has a control terminal for receiving the inverted enable signal ENB, a first terminal coupled to the supply voltage VDD, and a second terminal coupled to the first inverter 620 or the second inverter 630. When the enable signal EN has a low logic level and the ring oscillator 600 operates in the standby mode, the first switch 650 and the second switch 660 are both opened, such that the first inverter 620 and the second inverter 630 are both disabled for eliminating the current leakage and reducing the total power consumption of the ring oscillator 600.

Figure 8:
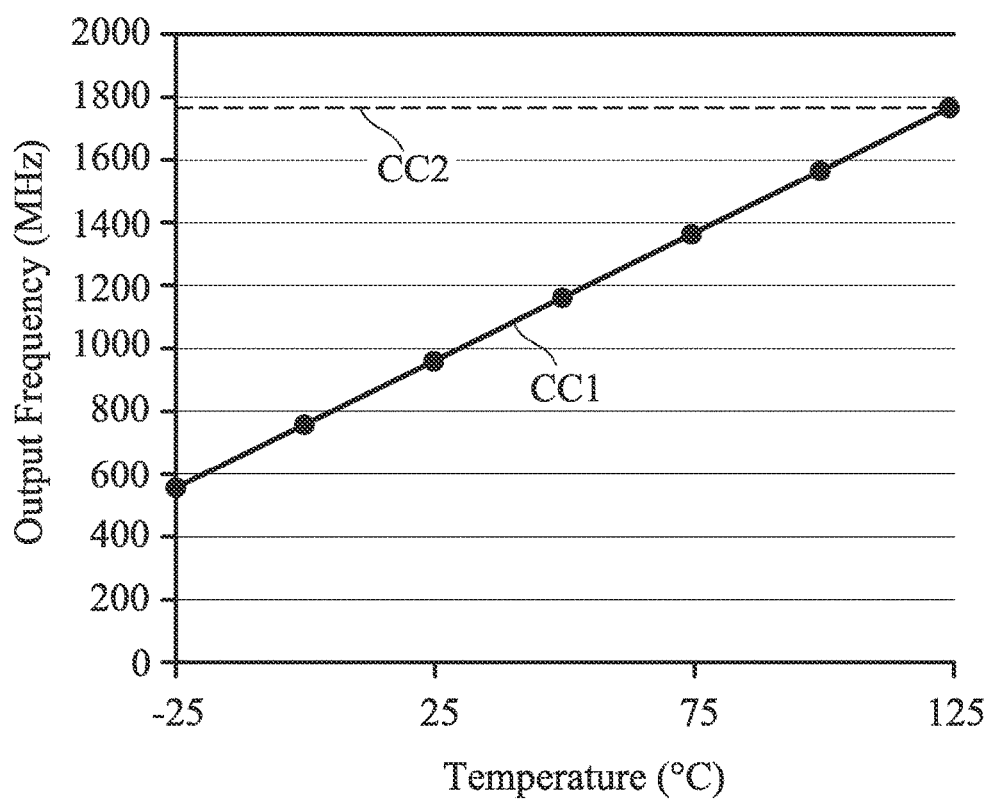
FIG. 8 is a diagram of the relationship between output frequency and temperature of a ring oscillator according to an embodiment of the invention.

The characteristic of the ring oscillator 600 are shown in FIG. 8. FIG. 8 is a diagram of the relationship between the output frequency and the temperature of the ring oscillator 600 according to an embodiment of the invention. The horizontal axis represents the temperature of the ring oscillator 600 (unit: degree Celsius), and the vertical axis represents the output frequency of the output signal SOUT from the ring oscillator 600 (unit: MHz). There are a first curve CC1 and a second curve CC2 in FIG. 8. The first curve CC1 represents the characteristic of the proposed ring oscillator 600, and the second curve represents the characteristic of a conventional ring oscillator. According to the measurement result of FIG. 8, the output frequency of the ring oscillator 600 is substantially a linear function of the temperature of the ring oscillator 600. Specifically, if the temperature of the ring oscillator 600 increases by 1 degree Celsius, the output frequency of the ring oscillator 600 may increase by about 9 MHz. Conversely, if the temperature of the ring oscillator 600 decreases by 1 degree Celsius, the output frequency of the ring oscillator 600 may decrease by about 9 MHz. Since the ring oscillator 600 has good linearity between its output frequency and its temperature, the ring oscillator 600 can be used as a thermal sensor, and a processor or a user can obtain the temperature on the chip by monitoring and analyzing the output frequency of the ring oscillator 600. In comparison, the second curve CC2 shows that the conventional ring oscillator has relatively low temperature sensitivity (about 0.2 MHz per degree Celsius), and it cannot indicate the temperature accurately. Accordingly, the proposed ring oscillator 600 of the invention at least has the advantages of high temperature sensitivity, good linearity, small size, and digital output. The proposed ring oscillator 600 can be used as an accurate thermal sensor and suitable for application in a variety of integrated circuits.

Figure 7:
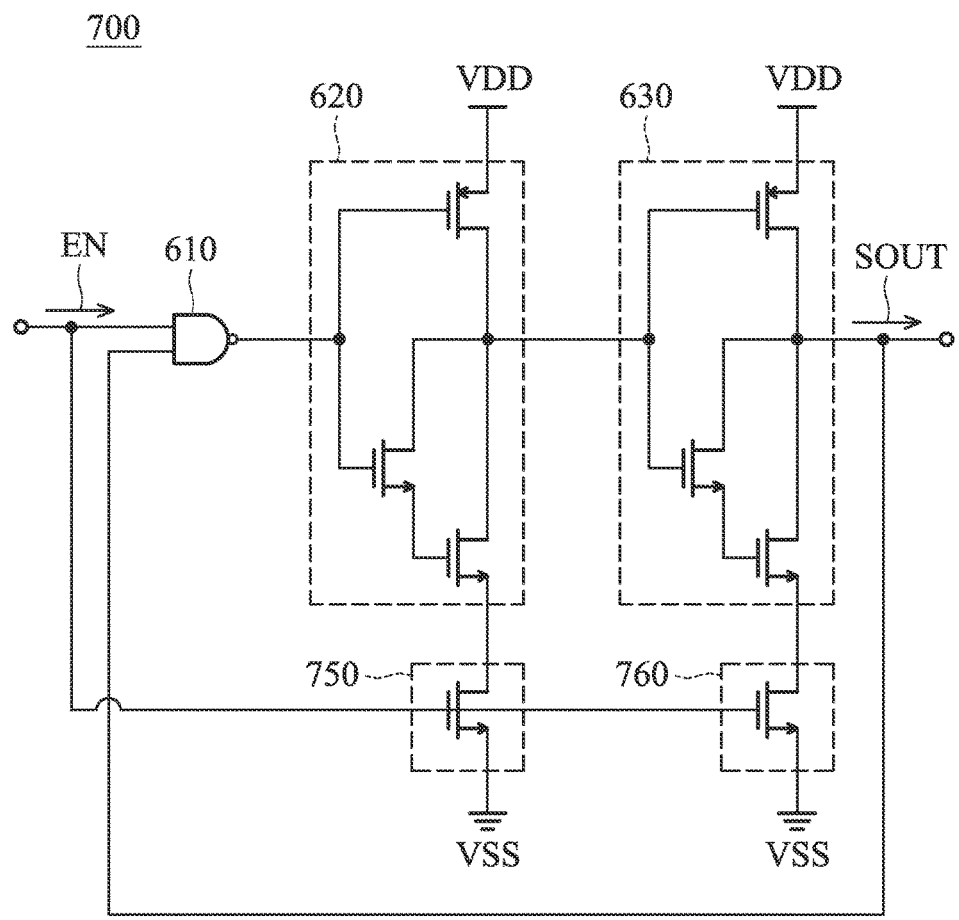
FIG. 7 is a diagram of a ring oscillator according to an embodiment of the invention.

FIG. 7 is a diagram of a ring oscillator 700 according to an embodiment of the invention. In the ring oscillator 700 the embodiment of FIG. 7, a third switch 750 and a fourth switch 760 are added. The third switch 750 is coupled between the first inverter 620 and the ground voltage VSS. The third switch 750 selectively enables and disables the first inverter 620 according to the enable signal EN. The fourth switch 760 is coupled between the second inverter 630 and the ground voltage VSS. The fourth switch 760 selectively enables and disables the second inverter 630 according to the enable signal EN. Specifically, each of the third switch 750 and the fourth switch 760 may be implemented with an NMOS transistor, which has a control terminal for receiving the enable signal EN, a first terminal coupled to the ground voltage VSS, and a second terminal coupled to the first inverter 620 or the second inverter 630. When the enable signal EN has a low logic level and the ring oscillator 700 operates in the standby mode, the third switch 750 and the fourth switch 760 are both opened, such that the first inverter 620 and the second inverter 630 are both disabled for eliminating the current leakage and reducing the total power consumption of the ring oscillator 700. Other features of the ring oscillator 700 of FIG. 7 are similar to those of the ring oscillator 600 of FIG. 6. As a result, the two embodiments can achieve similar levels of performance. It should be understood that the first switch 650 and the second switch 660 of FIG. 6 may be combined with the third switch 750 and the fourth switch 760 of FIG. 7, and the four switches may be design together in the same ring oscillator (not shown) for reduction of power consumption.

The invention provides a novel inverter and a novel ring oscillator. By using the circuit structure of diode-connected transistors, the proposed inverter and ring oscillator can show good output linearity relative to their temperature, and they can be configured as thermal sensors for monitoring the temperature on the chip. The small-size and digital-output characteristics of the invention are important in the field.

The above parameters are just exemplary, rather than limitations of the invention. One of ordinary skill may adjust these settings according to different requirements. It should be understood that the proposed inverter and ring oscillator are not limited to the configurations of FIGS. 1-8. The invention may merely include any one or more features of any one or more embodiments of FIGS. 1-8. In other words, not all of the features shown in the figures should be implemented in the inverter and ring oscillator of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An inverter with an input node and an output node, comprising:
   a first converter, coupled between a supply voltage and the output node; and
   a second converter, coupled between the output node and a ground voltage;
   wherein the second converter comprises:
   a first NMOS transistor (N-type Metal Oxide Semiconductor Field Effect Transistor), wherein the first NMOS transistor has a control terminal coupled to the input node, a first terminal, and a second terminal coupled to the output node; and
   a second NMOS transistor, wherein the second NMOS transistor has a control terminal coupled to the first terminal of the first NMOS transistor, a first terminal coupled to the ground voltage, and a second terminal coupled to the output node.

2. The inverter as claimed in claim 1, wherein a propagation delay time of the inverter is substantially a linear function of a temperature of the inverter.

3. The inverter as claimed in claim 1, wherein the first converter comprises:
   a PMOS transistor (P-type Metal Oxide Semiconductor Field Effect Transistor), wherein the PMOS transistor has a control terminal coupled to the input node, a first terminal coupled to the supply voltage, and a second terminal coupled to the output node.

4. The inverter as claimed in claim 1, wherein the first converter comprises:
   a first PMOS transistor (P-type Metal Oxide Semiconductor Field Effect Transistor), wherein the first PMOS transistor has a control terminal coupled to the input node, a first terminal, and a second terminal coupled to the output node; and
   a second PMOS transistor, wherein the second PMOS transistor has a control terminal coupled to the first terminal of the first PMOS transistor, a first terminal coupled to the supply voltage, and a second terminal coupled to the output node.

5. The inverter as claimed in claim 1, further comprising:
   a first switch, coupled between the supply voltage and the first converter, wherein the first switch selectively enables and disables the first converter according to an inverted enable signal.

6. The inverter as claimed in claim 1, further comprising:
   a second switch, coupled between the second converter and the ground voltage, wherein the second switch selectively enables and disables the second converter according to an enable signal.

7. A ring oscillator, comprising:
   a control gate;
   a first inverter;
   a second inverter;
   wherein a ring structure is formed by cascading the control gate, the first inverter, and the second inverter;
   wherein each of the first inverter and the second inverter has an input node and an output node, and comprises:
   a first converter, coupled between a supply voltage and the output node; and
   a second converter, coupled between the output node and a ground voltage;
   wherein the second converter comprises:
   a first NMOS transistor (N-type Metal Oxide Semiconductor Field Effect Transistor), wherein the first NMOS transistor has a control terminal coupled to the input node, a first terminal, and a second terminal coupled to the output node; and
   a second NMOS transistor, wherein the second NMOS transistor has a control terminal coupled to the first terminal of the first NMOS transistor, a first terminal coupled to the ground voltage, and a second terminal coupled to the output node.

8. The ring oscillator as claimed in claim 7, wherein a propagation delay time of each of the first inverter and the second inverter is substantially a linear function of a temperature of the ring oscillator.

9. The ring oscillator as claimed in claim 8, wherein if the temperature of the ring oscillator increases by 1 degree Celsius, an output frequency of the ring oscillator increases by about 9 MHz.

10. The ring oscillator as claimed in claim 7, wherein the control gate is a NAND gate and has a first input terminal for receiving an enable signal, a second input terminal coupled to the output node of the second inverter, and an output terminal coupled to the input node of the first inverter.

11. The ring oscillator as claimed in claim 10, further comprising:
    a third inverter, wherein the third inverter has an input terminal for receiving the enable signal, and an output terminal for outputting an inverted enable signal;
    a first switch, coupled between the supply voltage and the first inverter, wherein the first switch selectively enables and disables the first inverter according to the inverted enable signal; and
    a second switch, coupled between the supply voltage and the second inverter, wherein the second switch selectively enables and disables the second inverter according to the inverted enable signal.

12. The ring oscillator as claimed in claim 10, further comprising:
    a third switch, coupled between the first inverter and the ground voltage, wherein the third switch selectively enables and disables the first inverter according to the enable signal; and
    a fourth switch, coupled between the second inverter and the ground voltage, wherein the fourth switch selectively enables and disables the second inverter according to the enable signal.

13. The ring oscillator as claimed in claim 7, wherein the first converter comprises:
    a PMOS transistor (P-type Metal Oxide Semiconductor Field Effect Transistor), wherein the PMOS transistor has a control terminal coupled to the input node, a first terminal coupled to the supply voltage, and a second terminal coupled to the output node.

14. The ring oscillator as claimed in claim 7, wherein the first converter comprises:
    a first PMOS transistor (P-type Metal Oxide Semiconductor Field Effect Transistor), wherein the first PMOS transistor has a control terminal coupled to the input node, a first terminal, and a second terminal coupled to the output node; and
    a second PMOS transistor, wherein the second PMOS transistor has a control terminal coupled to the first terminal of the first PMOS transistor, a first terminal coupled to the supply voltage, and a second terminal coupled to the output node.

15. A thermal sensor comprising:
a ring oscillator as claimed in claim 7;
wherein an output frequency of the ring oscillator is used to indicate a temperature of the ring oscillator.

* * * * *